United States Patent
Kunii

(10) Patent No.: US 7,483,226 B2
(45) Date of Patent: *Jan. 27, 2009

(54) ND FILTER, MANUFACTURING METHOD THEREOF, AND APERTURE DEVICE

(75) Inventor: Koki Kunii, Koriyama (JP)

(73) Assignee: Nidec Copal Corporation, Tokyo (JP)

( * ) Notice: Subject to any disclaimer, the term of this patent is extended or adjusted under 35 U.S.C. 154(b) by 310 days.

This patent is subject to a terminal disclaimer.

(21) Appl. No.: 11/231,903

(22) Filed: Sep. 22, 2005

(65) Prior Publication Data

US 2006/0068226 A1  Mar. 30, 2006

(30) Foreign Application Priority Data

Sep. 27, 2004  (JP) .............................. 2004-279750

(51) Int. Cl.
*G02B 5/22* (2006.01)

(52) U.S. Cl. .................. 359/888; 359/885; 359/588

(58) Field of Classification Search .................. 359/888, 359/585, 360, 891, 885
See application file for complete search history.

(56) References Cited

U.S. PATENT DOCUMENTS

| | | | | |
|---|---|---|---|---|
| 5,783,049 A * | 7/1998 | Bright et al. | ............ | 204/192.14 |
| 6,630,284 B1 * | 10/2003 | Maschwitz | ............... | 430/271.1 |
| 6,650,478 B1 * | 11/2003 | DeBusk et al. | ............... | 359/585 |
| 6,671,109 B2 * | 12/2003 | Kunii | ............ | 359/888 |
| 2006/0279866 A1 * | 12/2006 | Kunii | ............ | 359/888 |

FOREIGN PATENT DOCUMENTS

| | | |
|---|---|---|
| JP | 07-063915 | 3/1995 |
| JP | 08-134638 | 5/1996 |
| JP | 11-012720 | 1/1999 |
| JP | 2000-192226 | 7/2000 |
| JP | 2002-350610 | 12/2002 |
| JP | 2003-231966 | 8/2003 |

* cited by examiner

Primary Examiner—Audrey Y Chang
(74) Attorney, Agent, or Firm—Roberts Mlotkowski Safran & Cole, P.C.; Thomas W. Cole

(57) ABSTRACT

An ND filter of a thin film type is formed on a transparent substrate, such that a light-absorbing film and a dielectric film are laminated on the transparent substrate. The transparent substrate is formed of a resin film which can be fed at a constant speed. The light-absorbing film is deposited by sputtering a target material comprised of a metal or a mixture of a metal and a metal oxide onto the resin film traveling at the constant speed while using a mixture gas of oxygen, nitrogen, and argon as an ambient gas. Consequently, the light-absorbing film is composed of a mixture of the metal and metal compounds, and has an extinction coefficient of 0.3 or more in a visible wavelength range. Typically, the light-absorbing film is composed of 1% through 50% by weight of the metal, 30% or more by weight of saturated metal oxide, and residual components composed of the compounds of the metal containing lower oxide and nitride of the metal.

7 Claims, 5 Drawing Sheets

ND FILTER, MANUFACTURING METHOD THEREOF, AND APERTURE DEVICE

BACKGROUND OF THE INVENTION

1. Technical Field

The present invention relates to an ND filter and a manufacturing method thereof. The ND (neutral density) filter is used for absorbing the amount of incident light so as to uniformly decrease the amount of transmissive light over an entire visible range.

2. Related Art

Generally, when the brightness of an object is too high for an imaging system such as a camera and a video, although minimizing an aperture stop (minimizing an aperture diameter), an excessive amount of light may enter into a light-sensitive surface. To solve this problem, it is a common practice to attach an ND filter to a part of the imaging system so as to limit the amount of light incident on the light-sensitive surface. In this case, the ND filter has spectral characteristics of simply decreasing the amount of incident light and therefore needs to ensure uniform transmittance over an entire visible wavelength range.

Until now, a plastic film-based ND filter has been used for the imaging system such as a camera and a video in order to uniformly decrease the amount of light over the entire visible range. For example, patent document 1 proposes an ND filter composed of alternate layers of two types or more of Ti metal-oxide films (with extinction coefficient k ranging from 1.0 to 3.0) and dielectric films ($Al_2O_3$, $SiO_2$, and $MgF_2$). Patent document 2 discloses an ND filter that is composed of alternate layers of $SiO_2$ and Nb and that is fabricated by the roll coating method using sputtering. In addition, patent documents 3 through 6 disclose methods of forming titanium oxide ($TiO_2$) mainly for photocatalyst and optical uses.

[Patent document 1] Japanese Patent Laid open Publication No. Hei 07-063915

[Patent document 2] Japanese Patent Laid open Publication No. 2002-350610

[Patent document 3] Japanese Patent Laid open Publication No. Hei 08-134638

[Patent document 4] Japanese Patent Laid open Publication No. Hei 11-012720

[Patent document 5] Japanese Patent Laid open Publication No. 2000-192226

[Patent document 6] Japanese Patent Laid open Publication No. 2003-231966

With respect to the ND filter described in patent document 1, a process temperature of 150° C. or higher is used to form the light-absorbing film composed of two types or more of Ti metal oxides. When a resin film is used as the substrate, applying a process temperature over 150° C. may deform the substrate or crack a film due to a heat or film stress. The lower-oxide target is used as a raw material for deposition of an absorption film containing two types or more of Ti metal oxides. That lower-oxide target is costly. The ND filter described in patent document 2 uses the thin film laminated structure made by alternately laying a transparent dielectric film of $SiO_2$ and a light-absorbing film of metal Nb. However, this ND filter does not yet reliably ensure the neutrality currently requested in the market for the overall visible range. Patent documents 3 through 6 describe various techniques to form titanium oxide ($TiO_2$). These techniques aim at stably fabricating a transparent film in the visible range. Even the same titanium oxide is not always applicable for yielding the light-absorbing film.

SUMMARY OF THE INVENTION

The present invention has been made in consideration of the foregoing. It is therefore an object of the present invention to provide an ND filter and a method of manufacturing the same with excellent neutrality in a visible wavelength range and improved reliability and productivity. To achieve this object, the following are taken into considerations. That is, the present invention provides an ND filter of a thin film type comprising a transparent substrate, and a light-absorbing film and a dielectric film laminated on the transparent substrate, wherein the transparent substrate comprises a resin film which can be fed at a constant speed, wherein the light-absorbing film is deposited by sputtering a target material comprised of a metal or a mixture of a metal and a metal oxide onto the resin film traveling at the constant speed while using a mixture gas of oxygen, nitrogen, and argon as an ambient gas, and wherein the light-absorbing film comprises a mixture of the metal and metal compounds, and has an extinction coefficient of 0.3 or more in a visible wavelength range.

Preferably, the light-absorbing film is composed of 1% through 50% by weight of the metal, 30% or more by weight of saturated oxide of the metal, and residual components composed of the metal compounds containing lower oxide and nitride of the metal. The light-absorbing film has a composition of the metal, the saturated oxide of the metal and the residual components, which is controlled by means of plasma state stabilization using a plasma monitor. The light-absorbing film also has a refractive index and a physical film thickness, which are controlled by means of a film thickness monitor using polarized light to make them inline managed during the course of the sputtering. A material of the metal of the light-absorbing film is selected from a group consisting of Ti, Cr, Ni, NiCr, NiFe, and NiTi. The dielectric film is composed of $SiO_2$ and deposited onto the resin film traveling at the constant speed by sputtering a target material composed of Si or Si oxide. The light-absorbing film and the dielectric film are deposited onto the resin film at a process temperature of 150° C. or less. Such an ND filter is used for an aperture device.

The present invention also provides a method of manufacturing an ND filter of a thin film type by laminating a light-absorbing film and a dielectric film on a transparent substrate, the method comprising the steps of: feeding a transparent substrate composed of a resin film at a constant speed; forming a dielectric film on the transparent substrate; and depositing a light-absorbing film by sputtering a target material composed of a metal or a mixture of a metal and a metal oxide onto the resin film traveling at the constant speed while using a mixture gas of oxygen, nitrogen, and argon as an ambient gas during the course of the sputtering, wherein the deposited light-absorbing film comprises a mixture of the metal and metal compounds, and has an extinction coefficient of 0.3 or more in a visible wavelength range.

The inventive method deposits a light-absorbing film and a dielectric film on a resin film traveling at a constant speed to obtain a thin film ND filter. Typically, the roll coating method is used to alternately deposit the light-absorbing film and the dielectric film by feeding the resin film to improve the productivity of ND filter. The light-absorbing film deposition employs the sputtering method using metal (M) or a mixture of metal (M) and metal oxide (MOx) as a target and a mixture gas of oxygen, nitrogen, and argon as an ambient gas. This makes it possible to obtain the composition of the light-absorbing film excellent in the reliability. The light-absorbing film obtained in this manner is controlled so as to keep its extinction coefficient to be 0.3 or more. On the other hand, the sputtering method or the vacuum evaporation method is used for the dielectric film to deposit $SiO_2$ on a resin film traveling at a constant speed. The deposition process for light-absorbing films and dielectric films is controlled to be heated at 150° C. or less to prevent the substrate from being deformed or a film from being cracked due to a heat or film stress. Especially when the light-absorbing film is deposited, the plasma monitor is used for plasma state stabilization to control the composition of the light-absorbing film. In addition, the film thickness monitor using polarized light inline manages the refractive index and the physical film thickness. The extinction coefficient is maintained to be 0.3 or more. In this manner, it is possible to provide the ND filter that excels in the neutrality in a visible range and that ensures the improved reliability and productivity.

DETAILED DESCRIPTION OF THE INVENTION

Figure 1:
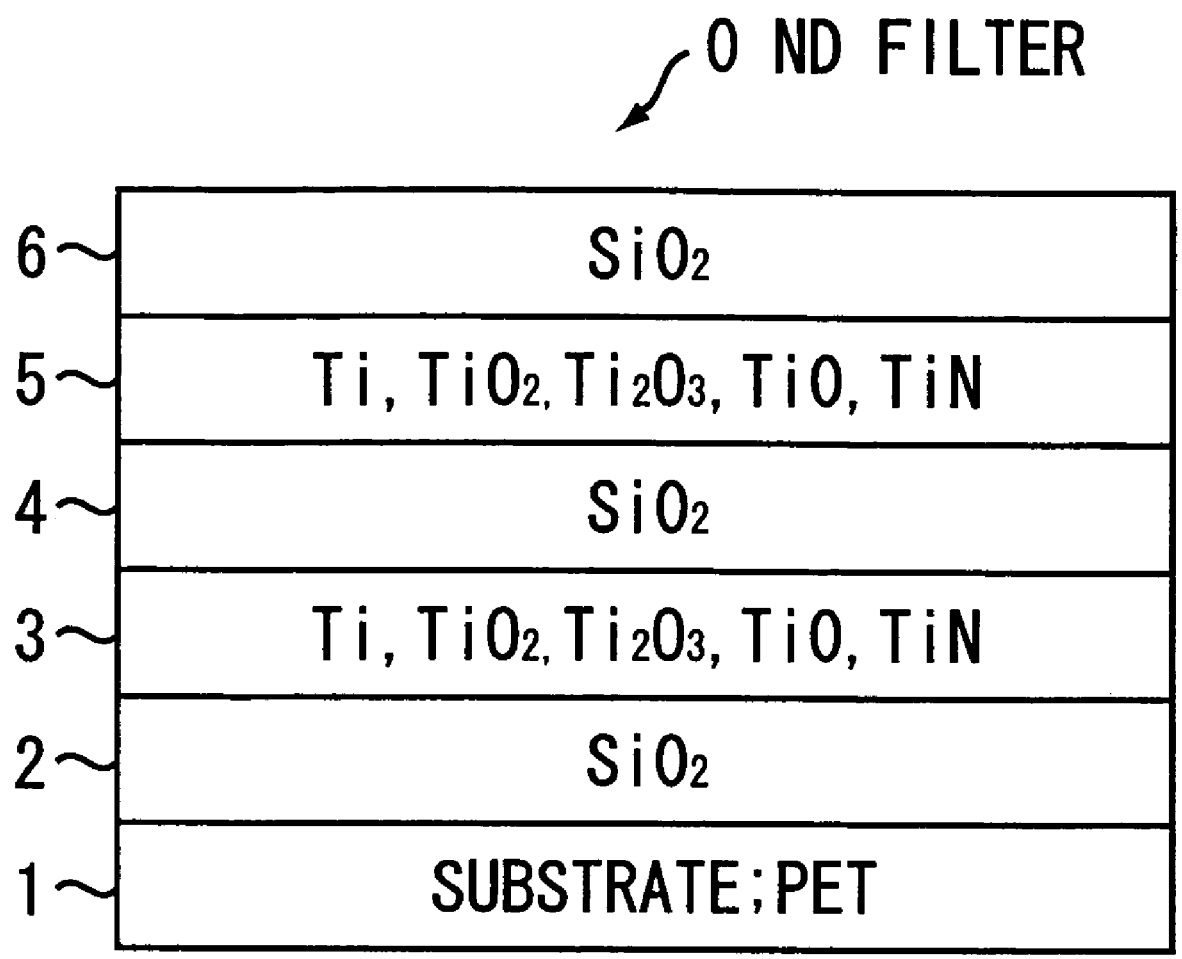
FIG. 1 is a schematic section view showing the layer configuration of an ND filter according to the present invention.

Embodiments of the present invention will be described in further detail with reference to the accompanying drawings. FIG. 1 is a schematic sectional view showing the configuration of a thin film ND filter according to the present invention. As shown in FIG. 1, an ND filter 0 is a thin film type formed by laminating light-absorbing films 3 and 5 and dielectric films 2, 4, and 6 on a transparent substrate 1. Characteristically, the transparent substrate 1 is composed of a resin film that can be fed at a constant speed. The light-absorbing films 3 and 5 are composed of a mixture of a metal and a metallic compound. The light-absorbing films 3 and 5 are deposited by sputtering with ambient gas, i.e., a mixture gas of oxygen, nitrogen, and argon, to the constantly traveling film 1 while using a target composed of simple metal or a mixture of metal and metal oxide. The light-absorbing films 3 and 5 provide the extinction coefficient of 0.3 or more in the visible range by controlling the film thickness and composition. Generally, the material's refractive index is expressed as n=n0−ik, where n0 represents the real part of the refractive index and k represents the imaginary part thereof. Term k is added when the material is absorbent. This term is the extinction coefficient. When extinction coefficient k becomes smaller than 0.3, it is difficult to maintain the neutrality of the transmittance in a light wavelength region to be controlled.

The light-absorbing films 3 and 5 are preferably composed of 1% through 50% by weight of a simple metal and 30% or more by weight of the metal's saturated oxide. The residual components are composed of the metal's compounds containing the metal's lower oxide and nitride. The light-absorbing films 3 and 5 are capable of being subject to inline management of composition control by stabilizing plasma states using a plasma monitor, and inline management of the refractive index and the physical thickness based on a film thickness monitor using the polarized light. Metal materials for the light-absorbing films 3 and 5 are selectable from Ti, Cr, NiCr, NiFe, and NiTi. On the other hand, the dielectric films 2, 4, and 6 are composed of $SiO_2$ deposited by sputtering onto the constantly traveling film 1 using a target of Si or Si oxide. The light-absorbing films 3 and 5 and the dielectric films 2, 4, and 6 are deposited at the process temperature of 150° C. or lower. Limiting the process temperature to 150° C. or lower can prevent the film used as the transparent substrate 1 from being deformed thermally. When the process temperature exceeds 150° C., the amount of film contraction increases to greatly warp the film. Applying a higher process temperature may thermally decompose the film. The thin film ND filter fabricated in this manner can be used for an aperture device, for example.

With further reference to FIG. 1, the following describes the specific film configuration of the ND filter 0. The transparent substrate 1 is composed of PET (polyethylene terephthalate) with a thickness of 0.1 mm, for example. However, the present invention is not limited thereto and is applicable to polyester films other than PET and polycarbonate films. The substrate's transparency is especially required when the roll coating method is used to deposit light-absorbing films and dielectric films. In such case, it is preferable to use polyester films such as PET and polycarbonate films. A first dielectric film 2 is formed on the transparent substrate 1 and is composed of $SiO_2$. A first light-absorbing film 3 is deposited thereon by means of sputtering and is mainly composed of metal Ti and its saturated oxide $TiO_2$. The light-absorbing film 3 contains by-product materials such as lower oxide $Ti_2O_3$ and TiO and nitride compound TiN as the residual components. A second dielectric film 4 is deposited thereon by means of sputtering and is composed of $SiO_2$. A second light-absorbing film 5 is deposited thereon by means of sputtering, and likewise contains metal Ti and its saturated oxide $TiO_2$ as major components and lower oxide $Ti_2O_3$ and TiO and metal nitride TiN as the residual components. A third dielectric film 6 is deposited thereon and is composed of $SiO_2$. This layer configuration is only an example and does not limit the scope of the present invention. In terms of optical thin films, the dielectric film represents a ceramic material transparent at a normal serviceable wavelength. The dielectric films are laminated at appropriate thickness (several times as large as the wavelength) for creating an optical interference effect to adjust optical characteristics (amount of reflection, amount of transmission, polarization, phase, and the like) of incident light. On the other hand, the light-absorbing film literally absorbs light in a serviceable wavelength area. Normally, metal is used for the light-absorbing film in the visible wavelength range. The present invention improves optical characteristics and physical characteristics by especially allowing the metal to incorporate the metal's saturated oxide.

Figure 2:
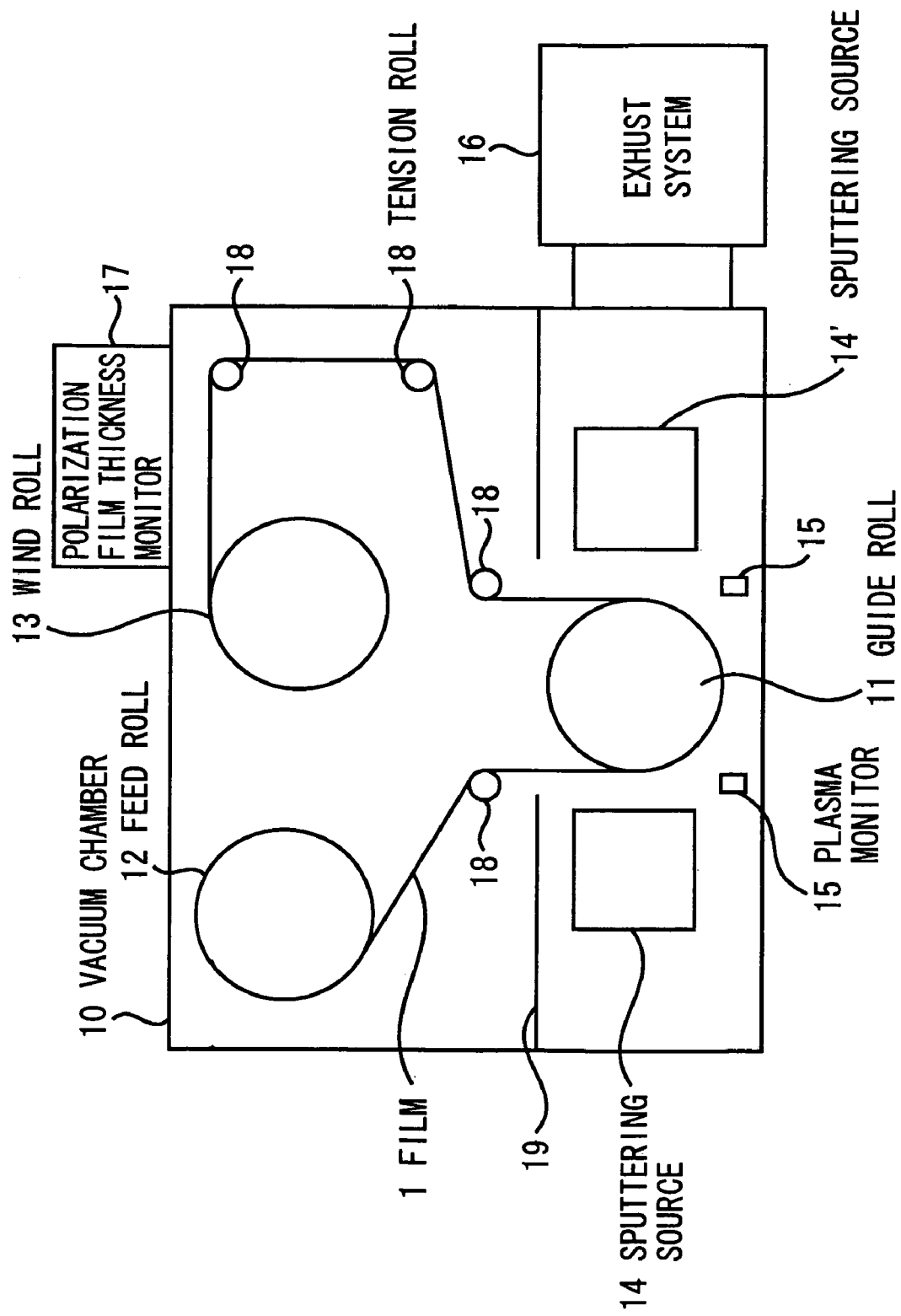
FIG. 2 is a schematic block diagram showing a deposition apparatus used for fabrication of the ND filter according to the present invention.

FIG. 2 schematically shows the configuration of a deposition apparatus used for fabrication of the ND filter as shown in FIG. 1. This deposition apparatus performs deposition on the surface of the film 1 using the so-called roll coating method to process the film while feeding it from one roll to the other roll.

The deposition apparatus is composed of a vacuum chamber 10 and enables the interior to be shut out from the open air. The vacuum chamber 10 is provided with an exhaust system 16 composed of a vacuum pump and the like and a gas introduction valve (not shown) to introduce ambient gas or reactive gas. Inside the vacuum chamber 10, there are provided a feed roll 12 to continuously feed the film 1, a guide roll 11, and a wind roll 13 to take up the fed film 1. In addition, several tension rolls 18 are properly disposed to form a travel path for the film 1 between the rolls 12, 11, and 13. Sputtering sources 14 and 14' are provided at one side of the resin film 1 to develop a thin film on it. According to the embodiment, one sputtering source 14 forms a light-absorbing film. The other sputtering source 14' forms a dielectric film. However, the present invention is not limited thereto. The positions of the sputtering sources 14 and 14' may be changed. Further, the sputtering sources 14 and 14' may be disposed in different vacuum chambers. A partition wall 19 is used to separate the film supply system composed of the feed roll 12, the wind roll 13, and the tension rolls 18 from the sputtering sources 14 and 14'.

The vacuum chamber 10 is equipped with a plasma monitor 15 and a polarization film thickness monitor 17. According to the example in FIG. 2, the polarization film thickness monitor 17 is placed outside the vacuum chamber 10 via a transparent window. The present invention is not limited thereto. The polarization film thickness monitor 17 may be installed in the vacuum chamber 10. The plasma monitor 15 is placed in the vacuum chamber 10. The present invention is not limited thereto. The plasma monitor may be attached outside the vacuum chamber via a transparent window. The polarization film thickness monitor 17 is generally called an ellipsometer. The ellipsometer measures changes in the polarization state of the light reflected on an object surface. In realtime basis, the ellipsometer nondestructively measures optical constants such as a refractive index and the thickness of a thin film existing on the object surface. Generally, the ellipsometer radiates linear polarized light to a measurement specimen. A rotary analyzer and an optical detector are used to measure the intensity distribution of the polarized light reflected on the measurement specimen. In this manner, the ellipsometer detects the optical constant and the film thickness of the measurement specimen.

The deposition apparatus evacuates the chamber 10 containing a deposition object (film 1) up to a given vacuum pressure to maintain the reduced pressure state. The deposition apparatus then introduces source gas into the chamber and supplies the inner space with a high-frequency power from the outside to generate plasma. There is provided a technique that spectroscopically analyzes the plasma's emission spectrum to identify excitation species contained in the plasma. This technique is generally used to comprehend the deposition state of an object to be deposited. The plasma monitor 15 is attached to the vacuum chamber 10 for this purpose. The plasma monitor 15 uses an optical band pass filter that can pass only a specific wavelength band of the plasma. The plasma monitor 15 uses a photodiode or a phototransistor to convert an optical output from the optical band pass filter into an electric signal. The plasma monitor 15 amplifies the electric signal and uses a measurement device to monitor changes in the amount of plasma spark. It is a good practice to previously grasp the relationship between a plasma monitor output and a result of depositing of the object. In this case, monitoring an output from the plasma monitor 15 makes it possible to estimate the deposition state.

With further reference to FIG. 2, the following describes how to manufacture the ND filter. In the deposition apparatus shown in FIG. 2, the feed roll 12 rotates to feed the film 1 wound around it. The wind roll 13 rotates to take up the film 1 along the path as shown in FIG. 2. Rotational speeds of the feed roll 12 and the wind roll 13 can be adjusted to control a travel speed of the film 1 between both of the rolls. The film 1 fed from the feed roll 12 is taken up on the wind roll 13 via the tension rolls 18 and the guide roll 11. Along this travel path, one side of the film 1 is subject to the following processes in a given sequence. A plasma electrode (not shown) for cleaning generates a plasma discharge to clean the surface of the film 1. When the film 1 reaches a position on the guide roll 11 opposite to the sputtering source 14, the sputtering source 14 performs sputtering to form a light-absorbing film. When the film 1 reaches a position on the guide roll 11 opposite to the sputtering source 14', the sputtering source 14' performs sputtering to form a dielectric film. In this manner, the light-absorbing film and the dielectric film are formed on the film 1 sequentially. In addition, these layers can be successively formed on the film 1 by rotating the feed roll 12 and the wind roll 13 for deposition. The polarization film thickness monitor 17 constantly monitors thicknesses of deposited light-absorbing films and dielectric films. The plasma monitor 15 constantly monitors the plasma generated during the sputtering of the sources 14 and 14' to provide a feedback for the film thickness control.

When depositing a light-absorbing film, the inventive method especially introduces a mixture gas of oxygen, argon, and nitrogen as an ambient gas to deposit light-absorbing films with the extinction coefficient of 0.3 or larger in a region that stabilizes the deposition condition. When a target of Ti is used for the sputtering source, for example, the resulting light-absorbing film is mainly composed of $TiO_2$ and contains Ti metal and a mixture of lower oxides of Ti and a nitrogen compound of Ti. The light-absorbing film is preferably composed of 1% through 50% by weight of simple titanium metal and 30% by weight or more of the titanium metal's saturated oxide component. The residual components are composed of the titanium metal's lower oxide and the titanium metal's compound containing nitride. It is possible to improve the control accuracy for the optical characteristics and the thickness of the light-absorbing film having the above-mentioned composition. To do this, the plasma monitor 15 and the polarization film thickness monitor 17 apply feedbacks from detection results to the deposition conditions such as the gas mixture ratio and flow volume, the voltage applied during sputtering, and the film travel speed.

On the other hand, the dielectric film is deposited on the film 1 through the use of Si or $SiO_2$ as a target and a mixture of argon and oxygen as a sputtering gas.

Figure 3:
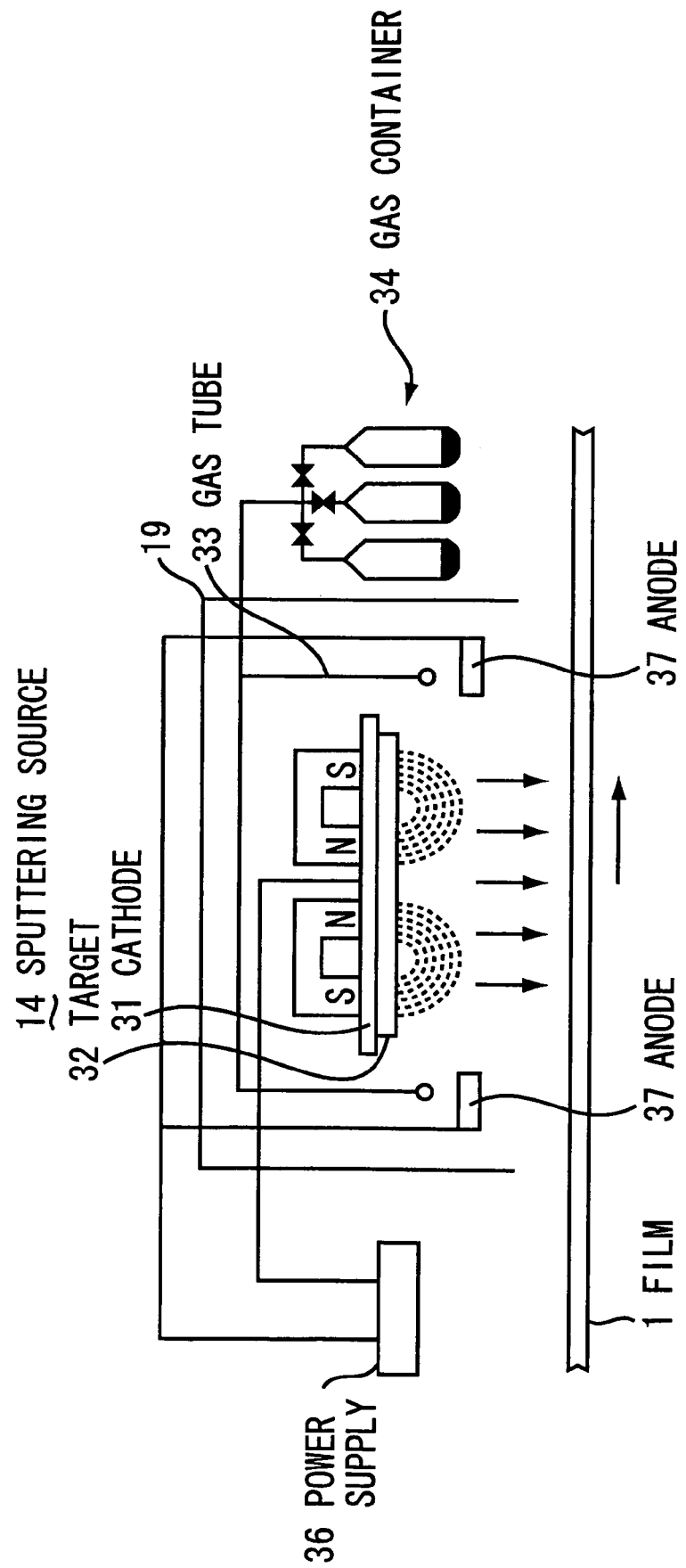
FIG. 3 is a schematic diagram showing a specific configuration of a sputtering source included in the deposition apparatus shown in FIG. 2.

FIG. 3 is a schematic diagram exemplifying the configuration of the sputtering source 14 built in the deposition apparatus in FIG. 2. As shown in FIG. 3, the sputtering source 14 basically constitutes a DC magnetron sputtering system. The sputtering source 14 supplies three types of gases (argon, oxygen, and nitrogen) conditioned as desired from a gas container 34 to a vacuum sputtering chamber separated by the partition wall 19. The gases are supplied from the left and the right of the target 32 through a gas tube 33. The target 32 to be used is made of titanium metal with the purity of 3N (99.9%). As Power supply 36, a DC power supply is used for causing discharge between an anode 37 and a cathode 31 to generate plasma of the respective gases. The film 1 travels in the direction of an arrow below the target 32. A titanium oxide film is deposited on the surface of the film 1.

To deposit the titanium oxide film, the sputtering chamber is supplied with the mixed gas of argon, oxygen, and nitrogen. The pressure is controlled to maintain the degree of vacuum in the range of 4.0 through $6.0 \times 10^{-1}$ Pa. Using a titanium metal target, the deposition is performed by controlling the power so as to keep 45 Kw (constant).

A preferable gas condition for the deposition may be 5% through 25% by volume of oxygen and 75% through 95% by volume of the sum of argon and nitrogen. Such condition can accelerate the deposition speed compared to the conventional sputtering deposition of titanium oxide films using the general-purpose gas condition (55% of oxygen, 44% of argon, and 0% of nitrogen by volume). Further, introducing nitrogen into the sputtering gas allows the light-absorbing film to contain not only the titanium metal and its saturated oxide, but also a titanium metal nitride. The presence of this nitride stabilizes the light-absorbing film.

Figure 4:
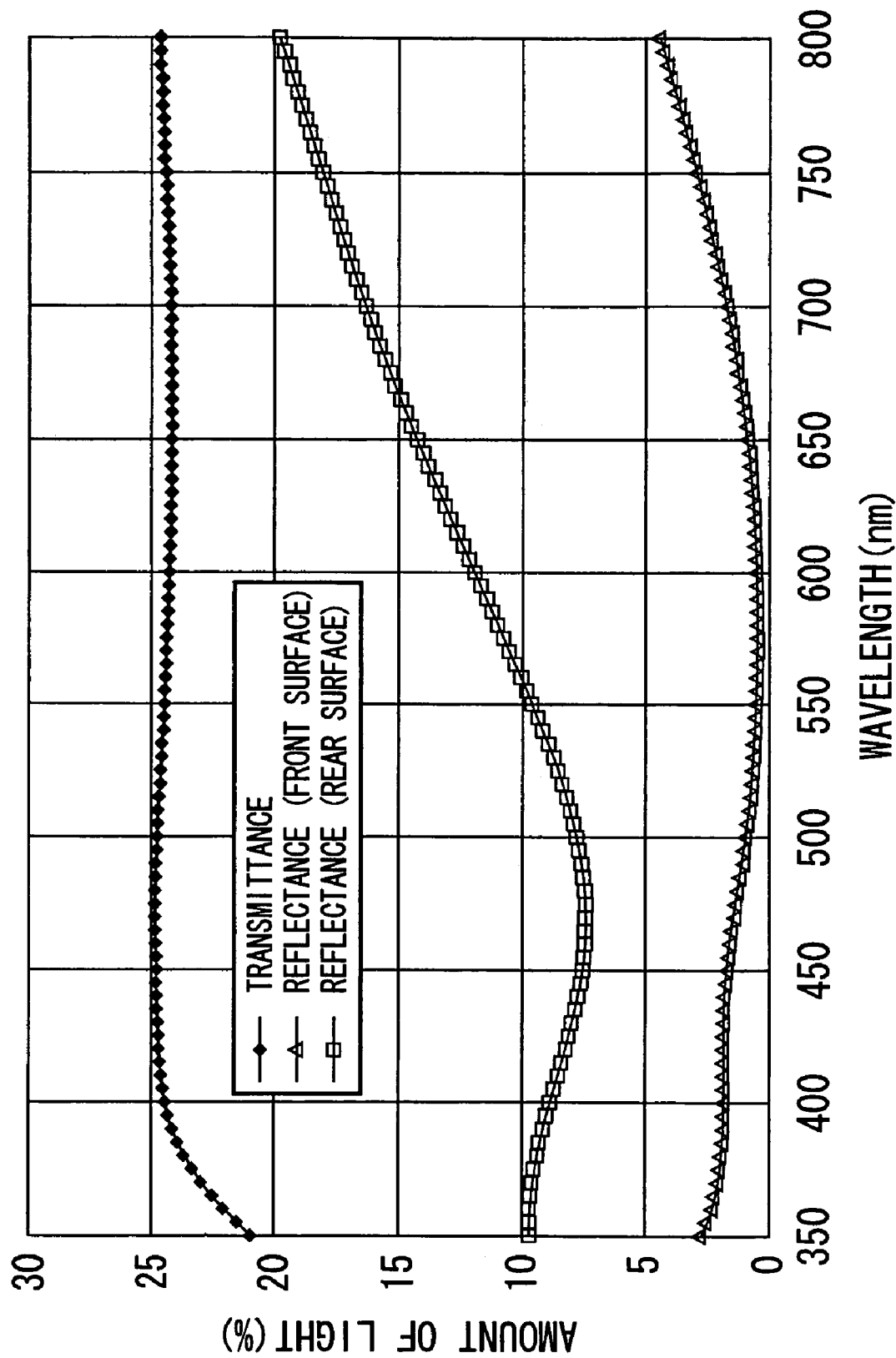
FIG. 4 is a graph showing optical characteristics of the ND filter according to the present invention.

FIG. 4 is a graph showing optical characteristics of the ND filter fabricated by the deposition apparatus shown in FIGS. 2 and 3. The ND filter has the layer configuration as shown in FIG. 1. Film thicknesses are 59 nm for the dielectric film 2, 28 nm for the light-absorbing film 3, 51 nm for the dielectric film 4, 25 nm for the light-absorbing film 5, and 78 nm for the dielectric film 6. The polarization film thickness monitor 17 in FIG. 2 controls the physical thicknesses of these dielectric films and light-absorbing films. The plasma monitor 15 in FIG. 2 provides feedback control for the composition and optical characteristics of these dielectric films and light-absorbing films. On the graph in FIG. 4, the abscissa shows wavelengths in a visible range. The ordinate shows the amount of light (%) representing the reflectance and the transmittance. As clearly understood from the graph, the ND filter indicates neutral transmission characteristics in the visible range. We have succeeded in fabricating the ND filter with the suppressed reflectance on the surface. Further, we have put the ND filter to an environmental test and found that the ND filter has indicated very excellent resistance. Depending on cases, it may be preferable to conduct the heat treatment in an oxygen atmosphere so as to stabilize unstable components such as lower oxide contained in the light-absorbing film.

Figure 5:
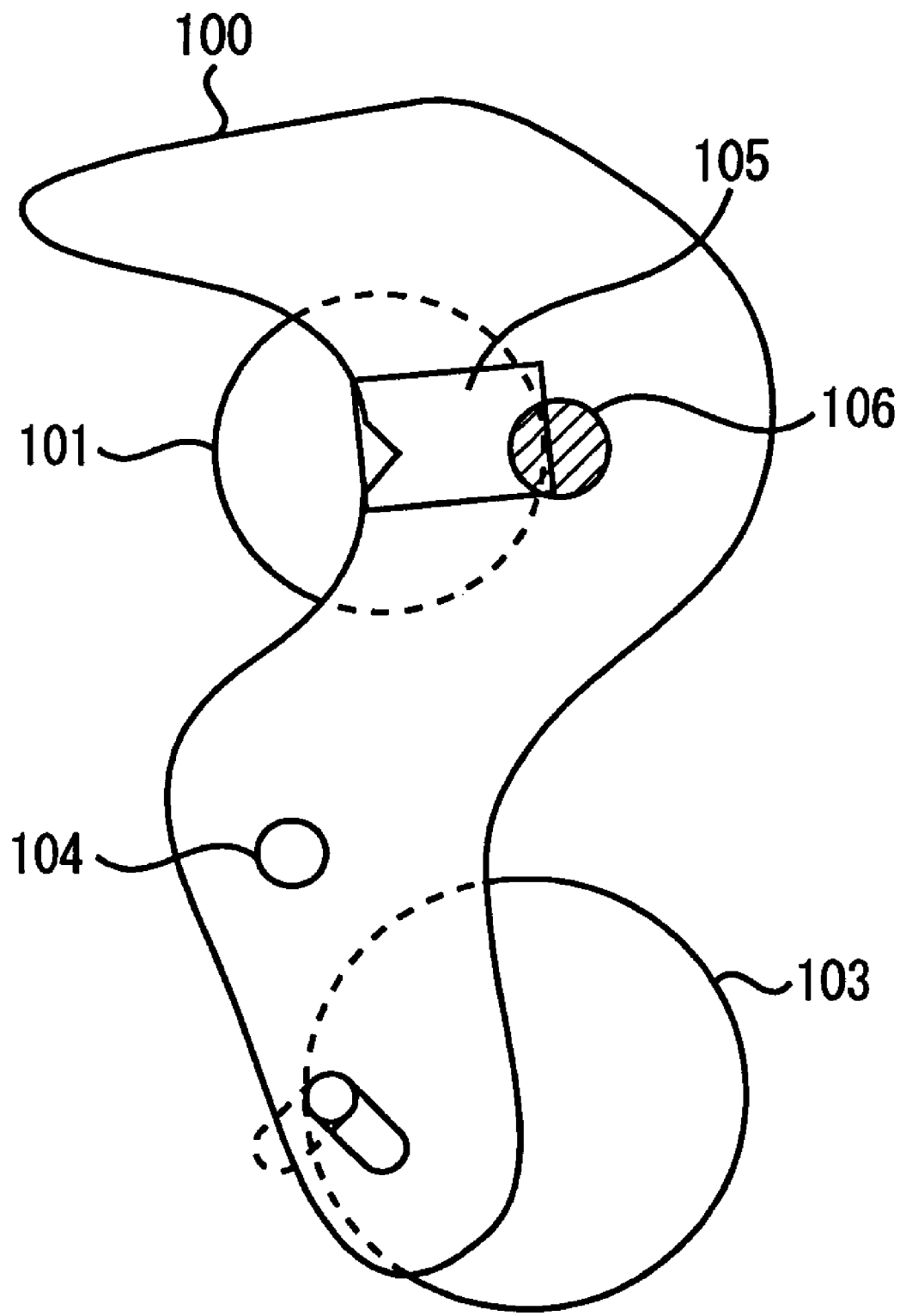
FIG. 5 is a schematic diagram showing the ND filter according to the present invention applied to an aperture device for cameras.

FIG. 5 is a schematic diagram showing the ND filter applied to an aperture device for cameras. An aperture diaphragm 100 represents one of a pair of aperture diaphragms mounted. An ND filter 105 is fixed to a recess of the aperture diaphragm 100 by means of adhesive 106 or hot welding. The aperture diaphragm 100 is constructed to rotatively move around a pin 104 by means of a drive device 103 so as to open and close an aperture 101.

What is claimed is:

1. An ND filter of a thin film type comprising: a transparent substrate; and a light-absorbing film and a dielectric film laminated on the transparent substrate, wherein
    the transparent substrate comprises a resin film which can be fed at a constant speed, wherein
    the light-absorbing film is deposited on the transparent substrate by sputtering a target material onto the resin film traveling at the constant speed while using a mixture gas of oxygen, nitrogen, and argon as an ambient gas, and wherein
    the light-absorbing film is composed of 1% through 50% by weight of a metal, 30% or more by weight of a saturated oxide of the metal, and residual components composed of compounds of the metal containing a lower oxide and nitride of the metal, and has an extinction coefficient of 0.3 or more in a visible waveform range.

2. The ND filter according to claim 1, wherein the composition of the light-absorbing film is controlled by means of plasma state stabilization using a plasma monitor, the light-absorbing film having a refractive index and a physical film thickness, which are controlled by means of a film thickness monitor using polarized light to make the refractive index and the physical film thickness inline managed during the course of the sputtering.

3. The ND filter according to claim 1, wherein a material of the metal of the light-absorbing film is selected from a group consisting of Ti, Cr, Ni, NiCr, NiFe, and NiTi.

4. The ND filter according to claim 1, wherein the dielectric film is composed of $SiO_2$ and deposited onto the resin film traveling at the constant speed by sputtering a target material composed of Si or Si oxide.

5. The ND filter according to claim 1, wherein the light-absorbing film and the dielectric film are deposited onto the resin film at a process temperature of 150° C. or less.

6. An aperture device using the ND filter according to claim 1.

7. A method of manufacturing an ND filter of a thin film type by laminating a light-absorbing film and a dielectric film on a transparent substrate, the method comprising the steps of:
    feeding a transparent substrate composed of a resin film at a constant speed;
    forming a dielectric film on the transparent substrate; and
    depositing a light-absorbing film by sputtering a target material onto the resin film traveling at the constant speed while using a mixture gas of oxygen, nitrogen, and argon as an ambient gas during the course of the sputtering,
    wherein the deposited light-absorbing film is composed of 1% through 50% by weight of a metal, 30% or more by weight of a saturated oxide of the metal, and residual components composed of compounds of the metal containing a lower oxide and nitride of the metal, and has an extinction coefficient of 0.3 or more in a visible wavelength range.

* * * * *